United States Patent [19]
Moriya

[11] Patent Number: 6,027,771
[45] Date of Patent: *Feb. 22, 2000

[54] LIQUID CRYSTAL POLYMER FILM AND A METHOD FOR MANUFACTURING THE SAME

[76] Inventor: Akira Moriya, 312, 66, Yamasaki, Okayama-shi, Okayama-ken 703, Japan

[ * ] Notice: This patent is subject to a terminal disclaimer.

[21] Appl. No.: 08/891,392

[22] Filed: Jul. 11, 1997

Related U.S. Application Data

[63] Continuation-in-part of application No. 08/392,433, Feb. 22, 1995, Pat. No. 5,681,624.

[30] Foreign Application Priority Data

| Feb. 25, 1993 | [JP] | Japan | 5-061045 |
| Feb. 23, 1994 | [JP] | Japan | 6-047963 |
| Jul. 19, 1996 | [JP] | Japan | 8-209210 |

[51] Int. Cl.[7] ............ B32B 27/08; B32B 27/20; B32B 31/12; B32B 31/16
[52] U.S. Cl. ............ 428/1; 428/304.4; 428/316.6; 428/317.1; 428/317.7; 428/318.4; 428/319.3; 428/323; 428/421; 428/422; 428/704; 428/910; 428/419; 264/288.8; 264/290.2; 264/348; 156/229; 156/247
[58] Field of Search ............ 428/1, 304.4, 306.6, 428/308.4, 316.6, 317.9, 318.4, 319.7, 319.9, 323, 419, 421, 422, 910, 317.1, 317.73, 319.3, 704; 264/288.8, 290.2, 348; 156/229, 247

[56] References Cited

U.S. PATENT DOCUMENTS

| 3,953,566 | 4/1976 | Gore | 264/288 |
| 3,962,153 | 6/1976 | Gore | 260/2.5 R |
| 4,096,227 | 6/1978 | Gore | 264/210 R |
| 4,187,390 | 2/1980 | Gore | 174/102 R |
| 4,387,133 | 6/1983 | Rinjiro et al. | 428/215 |
| 4,966,806 | 10/1990 | Lusignea et al. | 428/220 |
| 4,966,807 | 10/1990 | Harvey et al. | 426/220 |
| 4,975,312 | 12/1990 | Lusignea et al. | 428/209 |
| 5,039,208 | 8/1991 | Ohnishi et al. | 359/100 |
| 5,238,523 | 8/1993 | Yuasa et al. | 150/517 |
| 5,534,209 | 7/1996 | Moriya | 264/171.13 |
| 5,681,624 | 10/1997 | Moriya | 428/1 |

FOREIGN PATENT DOCUMENTS

| 0 232 422 | 8/1987 | European Pat. Off. . |
| 0 484 163 | 6/1992 | European Pat. Off. . |
| 0 512 397 | 11/1992 | European Pat. Off. . |
| 0 612 610 | 8/1994 | European Pat. Off. . |
| 60-172306 | 5/1985 | Japan . |
| 61 116 331 | 3/1986 | Japan . |
| 41 66 309 | 12/1992 | Japan . |
| 2 166 685 | 5/1986 | United Kingdom . |
| 89 12548 | 12/1989 | WIPO . |

OTHER PUBLICATIONS

Schmitz, Peter et al., "Films." Ullmann's Encyclopedia of Industrial Chemistry, 5th Ed., vol. A11, pp. 85–94, Jan. 1988.

*Primary Examiner*—Vivian Chen
*Attorney, Agent, or Firm*—Gary A Samuels

[57] ABSTRACT

A nonporous composite material laminate formed by combination of a liquid crystal polymer film with two support membranes and stretching the composite material laminate to provide a multiaxially-oriented liquid crystal polymer film, wherein the liquid crystal polymer film contains 1 to 30 volume percent of a solid particulate material in amounts sufficient to reduce the thickness variability of the film whereby the ratio of the standard deviation of thickness values to the mean thickness value of the film is 0.1 or less. The liquid crystal polymer film has balanced physical properties, uniform thickness, and smooth surfaces. A process for making the composite material and orienting the liquid crystal polymer is also disclosed.

21 Claims, 1 Drawing Sheet

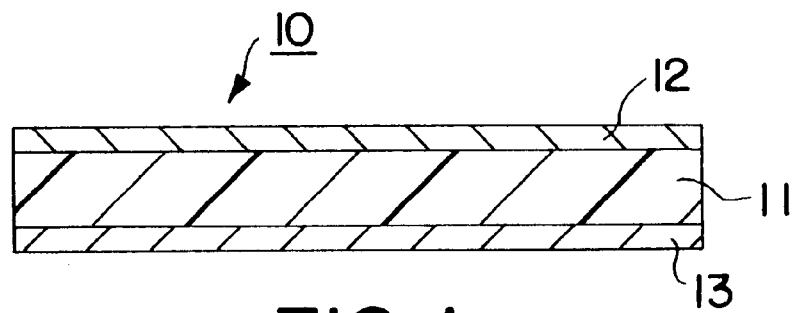
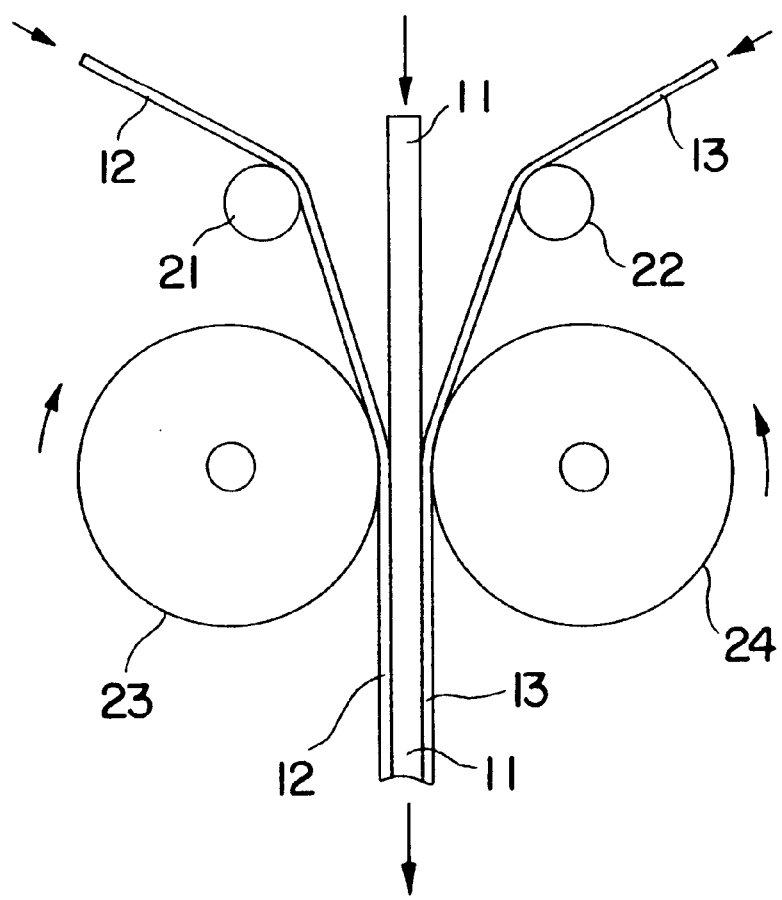

LIQUID CRYSTAL POLYMER FILM AND A METHOD FOR MANUFACTURING THE SAME

CROSS-REFERENCE TO RELATED APPLICATION

This application is a continuation-in-part of application Ser. No. 08/392,433, filed Feb. 22, 1995, U.S. Pat. No. 5,681,624.

FIELD OF THE INVENTION

The invention relates to liquid crystal polymer films and, more specifically, to multiaxially-oriented liquid crystal polymer films and to a method for producing them.

BACKGROUND OF THE INVENTION

Liquid crystal polymers are a family of materials that exhibit a highly ordered structure in the melt, solution, and solid states. They can be broadly classified into two types; lyotropic, having liquid crystal properties in the solution state, and thermotropic, having liquid crystal properties in the melted state. For convenience, and unless otherwise stated, the term "liquid crystal polymer", as used hereinafter, refers to thermotropic liquid crystal polymers, and is meant to include polymer alloys having a liquid crystal polymer component as well as liquid crystal polymers alone.

Most liquid crystal polymers exhibit excellent physical properties such as high strength, good heat resistance, low coefficient of thermal expansion, good electrical insulation characteristics, low moisture absorption, and are good barriers to gas flow. Such properties make them useful in a broad range of applications in the form of fibers, injection molded articles, and, in sheet form, as electronic materials for printed circuit boards, packaging, and the like.

However, many of the physical properties of liquid crystal polymers are very sensitive to the direction of orientation of the liquid crystal regions in the polymer. The ordered structure of the liquid crystal polymer is easily oriented by shear forces occurring during processing and highly aligned liquid crystal chains can be developed that are retained in the solid state, and result in highly anisotropic properties. Additionally, in many cases, articles formed of liquid crystal polymers, in which the liquid crystal polymer is anisotropically oriented, exhibit surface roughness and nonuniformity of thickness in the direction perpendicular to the direction of orientation. The surface topography is somewhat akin in appearance to that of a plowed field, having parallel ridges and valleys which are relatively uniform in the longitudinal direction of orientation, but can have considerable roughness and thickness variability in the transverse direction. This can be highly desirable for certain products, for example, in filaments, fibers, yarns, and the like. Such properties resulting from anisotropic orientation are often not desirable, however, in products having planar forms, such as tape, films, sheet, and the like; and in which smooth surfaces and uniform thickness may be important.

A number of methods are used to produce liquid crystal polymer materials in planar forms that have more balanced, less anisotropic properties. These include the use of multilayer flat dies which are oriented such that they extrude overlapping layers at intersecting angles, use of static mixer-agitators at the die inlets, and the like. More recently, dies having rotating or counter-rotating surfaces have become known in the art and successfully used. These extrusion techniques, used separately or in combination with other methods known in the art, such as film blowing, can produce liquid crystal polymer film and sheet that are multiaxially-oriented, that is, oriented in more than one direction, and have more balanced physical properties.

A characteristic of these methods is that locally, for example, at the surfaces of the sheet or film, the molecules are oriented in the planar x-y directions by shear imparted at the extrusion surfaces. In the z-direction, i.e., throughout the thickness, the x-y orientation of the molecules will change progressively from the orientation at one surface to the orientation at the other surface of the planar form. A drawback to these methods is that when attempting to make multiaxially-oriented films, the forces imparted by the extrusion surfaces to the liquid crystal polymer are exerted in opposing directions and the formation of pinholes, tears, and other imperfections, for example, separation of surface layers of the film can take place.

A method to reduce unevenness of thickness is suggested in Japanese Laid-Open Patent Application No.4-166309, which discloses calendering a thermotropic liquid crystal polymer sheet or film between rolls heated to a temperature greater than the glass-transition temperature and less than the melting temperature of the liquid crystal polymer. Compared to ordinary thermoplastic polymers, however, liquid crystal polymers exhibit relatively little softening at temperatures less than the melt temperature and high roll pressure, in the range 100–3000 kg/cm, is required by the process.

SUMMARY OF THE INVENTION

This invention provides a composite material comprising a multiaxially-oriented liquid crystal polymer film having very uniform thickness and exceptionally smooth planar surfaces.

The invention comprises the combination of a porous or nonporous support membrane of a synthetic polymer adhered to each side of a liquid crystal polymer film to form a nonporous composite material. In a preferred embodiment, the liquid crystal polymer film contains solid particulate material. The liquid crystal polymer film is adhered to the support membranes in laminar relationship, after which they are co-stretched in at least one direction to orient the liquid crystal polymer and produce a multiaxially-oriented liquid crystal polymer film. During the processing steps, the support membranes provide support to the liquid crystal polymer film and are the medium by which the liquid crystal polymer is uniformly oriented throughout the film thickness. One or both of the support membranes may be removed from the multiaxially-oriented liquid crystal polymer film after the orientation of the liquid crystal polymer has been completed.

Another embodiment of the invention is a process for producing a nonporous multiaxially-oriented liquid crystal polymer film comprising the steps of:

(a) providing an anisotropic liquid crystal polymer film wherein the liquid crystal polymer is oriented in substantially the same planar direction;

(b) sandwiching said anisotropic liquid crystal polymer film between two polymeric support membranes;

(c) bonding said anisotropic liquid crystal polymer film to said polymeric support membanes by application of heat and pressure to form a composite material;

(d) heating the composite material of step (c) while under tension to a temperature above the melt point of the liquid crystal polymer;

(e) stretching the heated composite material of step (d) in at least the planar direction normal to the direction of orientation of said anisotropic liquid crystal polymer film to multiaxially orient the liquid crystal polymer;

(f) cooling the multiaxially-oriented product of step (e);

thereby producing a liquid crystal polymer film having substantially equal values of at least one physical property selected from the group consisting of tensile strength, tensile elongation, and thermal expansion, in the direction of stretch and in the planar direction normal to the direction of stretch.

It is recognized that "membrane" and "film" can often be used interchangeably, however, to avoid confusion, "membrane" will generally be used herein with respect to the porous support material; and "film" with respect to liquid crystal polymer material.

By multiaxially-oriented liquid crystal polymer, as used herein, is meant liquid crystal polymer material to which forces in more than one direction have been applied to orient the liquid crystal polymer and obtain a liquid crystal polymer film having balanced physical properties.

The term "balanced" is used to describe orientation-sensitive physical properties, such as tensile strength, tensile elongation, thermal expansion, etc., resulting from orienting forces applied to the liquid crystal polymer film. By "balanced" is meant "to make or be equal or proportionate in amount", and is meant to be contra-indicative of "anisotropic." The term "balanced" is preferred to "isotropic" which means having physical properties that are the same regardless of the direction of measurement. For example, when a liquid crystal polymer film has orienting forces applied to it equally in the x-y planar directions, the values of an orientation-sensitive physical property, measured in the directions of the orienting forces, are substantially equal, but the values of the physical property measured in other directions may be somewhat different. Hence, it may not be appropriate to describe the composite material stretched in the planar x-y directions as isotropic.

By porous as used herein is meant a structure of interconnected pores or voids such that continuous passages and pathways throughout a material are provided.

BRIEF DESCRIPTION OF THE DRAWINGS

FIG. 1 is a cross-sectional view of the composite material of the invention.

FIG. 2 is a schematic drawing illustrating a method for adhering support membranes to a liquid crystal polymer film.

DETAILED DESCRIPTION OF THE INVENTION

Longitudinal direction, x-direction, and machine direction (MD) as used herein indicate the planar direction of manufacture of a film or sheet; transverse direction (TD) and y-direction indicate the planar direction normal to the direction of manufacture.

Materials for the support membrane of the invention are selected on the basis of their ability to withstand the forces and temperatures of processing, on their ability to be stretched, and on their chemical resistance to the liquid crystal polymers with which they are combined. The support membrane is preferably made of a synthetic polymer and may be porous or nonporous. Suitable synthetic polymers for both porous and nonporous support membranes include, but are not limited to, polyolefins, polyetheretherketones, polyimides, polyethersulfones, polyetherimides, polyarylates, polycarbonates, polystyrenes, polyvinyl chlorides, polyesters, polyamides, polyamideimides, and fluoropolymers, such as polytetrafluoroethylene, tetrafluoroethylene-(perfluoroalkyl) vinyl ether copolymer, tetrafluoroethylene-hexafluoropropylene copolymer, polyvinylfluoride, polyvinylidene fluoride, polytrichlorofluoroethylene, and the like. Of these thermoplastic polymers, fluoropolymers, including tetrafluoroethylene/(perfluoroalkyl) vinyl ether copolymer (PFA), tetrafluoroethylene/hexafluoropropylene copolymer (FEP), and polytetrafluoroethylene (PTFE), and the like; and polyethersulfones (PES) are preferred for their processing characteristics, temperature resistance, and chemical inertness. Porous and nonporous membranes of synthetic polymers listed above are known in the art and are commercially available.

The support membranes, porous and nonporous, should be in the range 5 to 300 micrometers thick, preferably in the range 20 to 150 micrometers thick. Porous support membranes should have an average pore size in the range 0.05 to 5.0 micrometers, preferably 0.2 to 3.0 micrometers; and a pore volume in the range 40 to 95 percent, preferably 60 to 85 percent.

Also, for the reasons given above, fluoropolymers are preferred as porous support membranes, and most preferred are porous membranes of polytetrafluoroethylene. Suitable porous polytetrafluoroethylene membranes can be made by processes known in the art, for example, by papermaking processes, or by processes in which filler materials are incorporated with the PTFE resin and are subsequently removed to leave a porous structure. Preferably the porous polytetrafluoroethylene membrane is porous expanded polytetrafluoroethylene membrane having a structure of interconnected nodes and fibrils, as described in U.S. Pat. Nos. 3,953,566, 3,962,153, 4,096,227, and 4,187,390 which fully describe the preferred material and processes for making them.

Examples of suitable thermotropic liquid crystal polymers include aromatic polyesters which exhibit liquid crystal properties when melted and which are synthesized from aromatic diols, aromatic carboxylic acids, hydroxycarboxylic acids, and other like monomers. Typical examples include a first type consisting of parahydroxybenzoic acid (PHB), terephthalic acid, and biphenol; a second type consisting of PHB and 2,6-hydroxynaphthoic acid; and a third type consisting of PHB, terephthalic acid, and ethylene glycol. They are represented below as Formulas 1, 2, and 3 respectively.

Formula 1

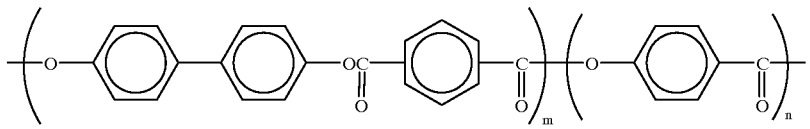

Formula 2

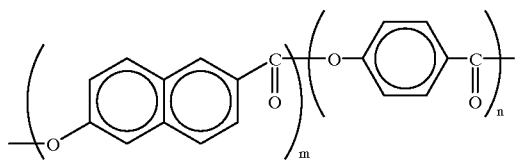

Formula 3

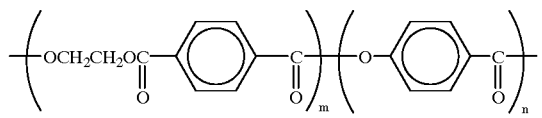

Also, in the present invention, a polymer alloy having a liquid crystal polymer component can be used. In such cases the polymer which is mixed with or chemically bonded to a liquid crystal polymer should have a melting temperature of 220° C. or higher, preferably about 280 to 380° C. Suitable alloying polymers can be selected from the group consisting of, but not limited to, polyetheretherketones, polyether sulfones, polyimides, polyetherimides, polyamides, polyamideimides, polyarylates, and the like. The polymers and liquid crystal polymer components are mixed in a weight ratio of 10:90 to 90:10, preferably in the range of 30:70 to 70:30.

The liquid crystal polymers and polymer alloys described hereinabove are meant for illustration and not for limitation of the invention. It is recognized by the inventor that many other liquid crystal polymers and polymer alloys suitable for use in the invention are known in the art. Likewise, it is recognized that compatibilizers, plasticizers, flame retardant agents, and other additives may be contained in the liquid crystal polymers of the invention.

In FIG. 1 is depicted a composite material laminate 10 comprising a thermotropic liquid crystal polymer film 11, on each side of which is adhered a support membrane 12, 13. The liquid crystal polymer film 11 can be formed by conventional processes, such as extrusion through a T-die or by extrusion and film-blowing, without consideration of the orientation of the liquid crystal polymer. Thus, relatively simple processes and equipment can be used, and the liquid crystal polymer film will generally be anisotropically oriented, having all or most of the liquid crystal polymer oriented in the same direction when limitations to the support membranes 12, 13. There are no particular limitaions to the thickness of an extruded liquid crystal polymer film, but it is typically in the range 20 micrometers to 5 millimeters thick, preferably in the range 50 to 800 micrometers thick, and most preferably in the range 80 to 200 micrometers thick. The support membranes 12, 13, are adhered to the liquid crystal polymer film 11 with sufficient bonding strength to permit subsequent stretching of the composite material laminate 10 as will be described hereinbelow.

It has been discovered that inclusion of solid particulate materials in the liquid crystal polymer film significantly reduces the thickness variability in the direction normal to the direction of orientation of an anisotropic liquid crystal polymer film such that, after the film has been bonded to and co-stretched with the support membranes, the ratio of the standard deviation of thickness values to the mean thickness value of the stretched article is 0.1 or lower, and is generally in the range 0.01 to 0.05. The smoothness of the stretched liquid crystal polymer film is also enhanced by the presence of the solid particulate material and generally has a surface roughness of 10 micrometers or less, preferably 5 micrometers or less.

The solid particulate filler material can be an organic or inorganic material having a melt temperature higher than the liquid crystal polymer with which it is mixed. Suitable inorganic fillers include, but are not limited to, silica, alumina, titanium oxide, and other metal oxides; carbonates, such as calcium carbonate and barium carbonate; sulfates, such as calcium sulfate and barium sulfate; titanates, such as potassium titanate and calcium titanate; talc, clay, mica, glass, and other silicates. Examples of suitable organic filler particles include, carbon, graphite, and high melt-temperature resin powders of synthetic polymers such as polyimides, polyetherimides, polyamideimides, polyetheretherketones, and fluoropolymers such as polytetrafluoroethylene (PTFE), tetrafluoroethylene-hexafluoropropylene copolymer (FEP), tetrafluoroethylene-(perfluoroalkyl) vinyl ether copolymer (PFA), ethylene/tetrafluoroethylene copolymer (ETFE), polytrichlorofluoroethylene (CTFE), polyvinylidene fluoride (PVDF), and the like. By "particulate" is meant individual particles of any aspect ratio and thus includes fibers and powders.

The particulate filler material should have a mean particle size in the range 0.01 to 50 micrometers, preferably in the range 0.1 to 10 micrometers. The concentration of particulate material in the liquid crystal polymer film should be in the range 1 to 30 volume percent, preferably in the range about 10 to about 20 percent. In too great a concentration the solid particulate material can adversely affect the properties of the liquid crystal polymer film; and in concentrations less than about 1 volume percent, have much reduced effect on thickness uniformity of the liquid crystal polymer film.

The particulate filler material can be mixed with liquid crystal polymer particles using conventional equipment and processes. For example, single- and twin-screw extruders, kneaders, blendors, choppers, and pelletizers, and the like, can be used to mix and prepare the materials which are then formed into a film by conventional uniaxial extrusion and/or film-blowing methods.

The thermotropic liquid crystal polymer film can be adhered to the support membranes using conventional lamination methods, for example, by application of heat and pressure by heated platens, or by passage through the nip of heated calender rolls. A suitable lamination method using heated calender rolls is shown in FIG. 2. As shown in the figure, a liquid crystal polymer film 11, which can be an anisotropic uniaxially-oriented film, is fed into the nip of heated calender rolls 23, 24, between support membranes 12, 13, which have passed over guide rolls 21, 22. The composite material laminate exits the nip with support membranes 12, 13 bonded to the liquid crystal polymer film 11. When a hot press apparatus is used, a first support membrane is placed on the bottom platen of the hot press, a liquid crystal polymer film is superposed on the first support membrane, and a second support membrane is superposed on the liquid crystal polymer film under the top platen of the press. The composite material laminate is then formed by application of heat and pressure between the heated platens, after which it is cooled and removed from the press. The melting temperature of the liquid crystal polymer should be lower than the melting temperature of the support membranes, and preferably lower than the softening temperature of the support membranes. Typically, the temperature of the platens or rolls is in the range 10 to 100° C. higher than the melt temperature of the liquid crystal polymer, but may be higher depending on the length of time that heat and pressure are applied to the materials.

As noted hereinabove, the support membranes 12, 13, are bonded to the liquid crystal polymer film 11 sufficiently strongly to permit stretching the composite material laminate 10 in a subsequent step. However, in many cases, it is desirable to remove one or both of the support membranes from the liquid crystal polymer film after the stretching step. In such cases the interlayer bond strength between the support membrane desired to be removed and the liquid crystal polymer film is controlled so that the force required to peel the support membrane from the liquid crystal polymer film is in the range 1 to 500 g/cm-width, preferably in the range 2 to 100 g/cm-width. If the peel strength is less than 1 g/cm-width, the support membrane may separate from the liquid crystal polymer film during the stretching step; and if the peel strength is more than 500 g/cm-width, the support membrane and liquid crystal polymer film may be difficult to separate. The interlayer bond strength (as measured by the peel strength) can be adjusted within these limits by selection of materials forming the layers and controlling lamination conditions. For example, by using nonporous support membranes or porous fluoropolymer membranes with fine pore size; and controlling process variables such as roll or platen temperature, lamination pressure, and residence time at temperature and pressure, low interlayer peel forces can be obtained. After stretching the composite material laminate, the support membrane can be easily removed and a liquid crystal polymer film having an exceptionally smooth surface and uniform thickness is provided.

In contrast to the above, in other cases, it is desirable that one or both of the support membranes be strongly bonded to the liquid crystal polymer film, and remain in place on the composite material laminate after stretching. By manipulating the material and lamination variables described above, a composite material laminate having strong interlayer bonds, and peel strengths greater than 500 g/cm-width, preferably greater than 1000 g/cm-width, most preferably greater than 1200 g/cm-width, can be obtained. For example, by using porous support membranes with more open structure and larger pore size; and, if needed, higher roll or platen temperature, higher lamination pressure, or longer residence time at temperature and pressure, high interlayer peel forces can be obtained.

From the foregoing it can be seen that wide latitude can be exercised in the selection of support membranes. In a given composite material laminate the support membranes can be the same or different in terms of their structure or material. For example, a porous polytetrafluoroethylene support membrane can be used on one side and a nonporous polyethersulfone membrane can be used on the other side. Accordingly, selection of support membranes can be made, within the limits given above, on the basis of cost, processing characteristics, or attributes desired in the final article.

The composite material laminate 10 formed of the thermotropic liquid crystal polymer film 11 and support membranes 12, 13, is then heated to a temperature at or above the melt point of the liquid crystal polymer and stretched in one or more directions. If the composite material laminate comprises an anisotropic uniaxially-oriented liquid crystal polymer film, the film must be stretched at least in the transverse-, or y-direction, i.e., the planar direction normal to the direction of orientation of the liquid crystal polymer in the film to develop multiaxial orientation of the liquid crystal polymer. Depending on the degree of orientation of the liquid crystal polymer in the unstretched composite material laminate, it may be desirable to stretch the composite material in two or more directions to obtain the best directional balance in orientation-sensitive physical properties, i.e. to approach isotropy as closely as possible. Stretching in two or more directions may be done simultaneously or sequentially, and may be done in one or more steps. The amount of stretch, relative to original dimensions in the planar x-y directions, is ordinarily in the range 1 to 10:1 in the longitudinal-, or x-direction, preferably in the range 1 to 5:1; and in the transverse direction, ordinarily in the range 1.5–20:1, preferably in the range 3 to 15:1. Additionally, the amount of stretch in the transverse direction should be 1 to 5 times, preferably 1 to 3 times, the amount of stretch in the longitudinal direction. The rate of stretch, also relative to the original dimensions, is generally in the range 1% to 200% per second, preferably in the range 5% to 50% per second.

Stretching may be done using conventional equipment or apparatus known in the art. For example, uniaxial or biaxial stretching in the planar x-y directions can be done, simultaneously or sequentially, using an x-y direction stretching pantograph. Also, uniaxial stretching equipment can be used sequentially, for example, differential speed rolls for stretching in the machine direction (MD) and tenter frames for stretching in the transverse direction (TD).

As the composite material laminate 10 is stretched in the planar x- or y-directions the area of its surface progressively increases and its thickness is progressively reduced. The melted liquid crystal polymer film, bonded to and supported by the support membranes, is also stretched by the stretching membranes, also increases in area in the planar x-y directions, and the liquid crystal regions of the film become uniformly oriented through the film thickness from one planar surface to the other, as well as in the planar stretch directions. The liquid crystal polymer film thus produced has virtually no orientation gradient or orientation layering effects in the z-direction, i.e., through its thickness At the same time, as there is no change in the volume of liquid crystal polymer, the liquid crystal polymer film becomes progressively thinner as the material of the film is dragged and spread by the stretching membrane.

By controlling the amount of stretch, rate of stretch and directions of stretch of the composite material, the liquid crystals can be aligned in a preferred orientation, or aligned multiaxially and more randomly to provide relatively balanced physical properties. In general, liquid crystal polymer films having balanced physical properties are very useful, in particular, for electronic applications such as printed circuit boards, and are preferred. By controlling the amount of liquid crystal polymer initially adhered to the porous support membranes, i.e., by using thicker or thinner starting films, and adjusting the amount of stretch to provide the desired increase in planar surface area, the thickness of the liquid crystal polymer film can be made as thin as 2 micrometers, but is preferably in the range about 10 to 300 micrometers thick, and more preferably, in the range 25 to 125 micrometers thick. Furthermore, the liquid crystal polymer film or layer remains intact, does not have holes or tears, has a very uniform thickness, is uniformly oriented from one planar surface to the other, and has a remarkably smooth surface.

After the stretching step the composite material should be heat treated to stabilize the physical properties and reduce strains in the liquid crystal polymer. The heat treatment is done with the material restrained to prevent shrinking. Heat treatment temperature will vary according to the thermotropic liquid crystal polymer used, but is generally in the range from slightly above the crystallizing point to slightly below the melt range of the liquid crystal polymer. Also, after the stretching step, one or both of the support membranes can be removed if so desired.

TEST DESCRIPTIONS

Tensile Test

Tensile strength and tensile elongation were measured in accordance with Japanese Industrial Standard JIS K 7127.

Measurement values are given in kg/mm$^2$, and are shown in Table 1.

Surface Roughness

Surface roughness of extruded liquid crystal polymer films, or films from which the support membrane was removed were measured by a profilometer, Model SURF-COM 1500A, made by Tokyo Seimitsu Co.

Roughness units are given in micrometers and, in accordance with Japanese Industry Standard JIS B0601, represent the arithmetic mean of the absolute value of the deviation from the center line.

Thickness Measurements

Thickness measurements of liquid crystal polymer films of Examples 5 through 10 were made using needle-type dial gauges having a tip radius of 0.4 mm. The dial gauges (made by Mitsutoyo Co.) were mounted vertically with the tips in contact with each other, under a load of 100 grams. A sample liquid crystal polymer film was then interposed between the tips and systematically moved in the transverse direction in about 0.5 mm increments across the tips. About 2000 thickness measurements were made across the width of the film from which mean and standard deviation values were calculated.

Without intending to limit the scope of the present invention, the article and method of production of the present invention may be better understood by referring to the following examples:

EXAMPLE 1

A film of thermotropic liquid crystal polymer resin (SUMIKA SUPER E 7000, manufactured by Sumitomo Chemical Co.) was prepared by melt-extrusion through a T-die using a single-screw extruder (screw diameter: 50 mm). The T-die had a lip length of 500 mm; lip clearance of 1 mm; and was operated at a temperature of 320° C. An anisotropic uniaxially-oriented liquid crystal polymer film, about 480 mm wide and 210 micrometers thick, was produced.

Nonporous polyethersulfone (PES) membranes, 25 micrometers thick, were bonded to each side of the liquid crystal polymer film. The materials were laminated by application of heat and pressure in passage through the nip between metal rolls heated to 330° C., at a nip pressure of about 20 kg/cm and roll surface speed of about 2 m/min. The composite material laminate thus formed was cooled by passage between 50 mm diameter rolls having a surface temperature of about 150° C.

The composite material laminate was mounted in a biaxial (x-y direction) stretching pantograph, heated to a temperature of about 315° C., and stretched in two directions a total amount of 3:1; an amount 1.2:1 in the longitudinal direction, and 2.5:1 in the transverse direction. The stretch rate was about 10%/sec. Stretching in each direction was done sequentially. The composite stretched material was then heat treated at a temperature of 260° C. for 10 minutes while restrained from shrinking.

After cooling, the PES support membranes were removed, yielding a liquid crystal polymer film 70 micrometers thick and having balanced physical properties. The peel force measured when the PES support membranes were removed from the liquid crystal polymer film was about 10 g/cm-width.

EXAMPLE 2

A film of thermotropic liquid crystal polymer resin (SUMIKA SUPER E 7000, manufactured by Sumitomo Chemical Co.) was prepared by melt-extrusion through a T-die using a single-screw extruder (screw diameter: 50 mm). The T-die had a lip length of 500 mm; lip clearance of 1 mm; and was operated at a temperature of 320° C. An anisotropic uniaxially-oriented liquid crystal polymer film, about 480 mm wide and 210 micrometers thick, was produced.

Porous expanded PTFE membranes (thickness: 40 micrometers; nominal pore size: 0.2 micrometers; pore volume: 80%; manufactured by Japan Gore-Tex, Inc.) were bonded to each side of the liquid crystal polymer film. The materials were laminated by application of heat and pressure in passage through the nip between metal rolls heated to 330° C., at a nip pressure of about 50 kg/cm and roll surface speed of about 2 m/min. The composite material laminate thus formed was cooled by passage between 50 mm diameter rolls having a surface temperature of about 150° C.

The composite material laminate was mounted in a biaxial (x-y direction) stretching pantograph, heated to a temperature of about 315° C., and stretched in two directions a total amount of 3:1; an amount 1.2:1 in the longitudinal direction, and 2.5:1 in the transverse direction. The stretch rate was about 10%/sec. Stretching in each direction was done sequentially. The composite stretched material was then heat treated at a temperature of 260° C. for 10 minutes while restrained from shrinking.

After cooling, the stretched composite material laminate was examined. The thickness of the stretched composite material laminate was determined to be about 70 micrometers. The liquid crystal polymer had penetrated into the porous expanded PTFE membrane, essentially fully occupying the pore volume to a depth of about 10 micrometers.

The expanded PTFE support membranes were strongly bonded to the liquid crystal polymer film. The bond strength was determined to be 1500 g/cm-width or higher.

EXAMPLE 3

A composite material laminate was prepared as described in Example 1, except that porous PES support membranes were used. The PES support films were strongly bonded to the liquid crystal polymer film, and the bond strength was determined to be 1300 g/cm-width or higher.

EXAMPLE 4

A composite material laminate was prepared as described in Example 1, except that a nonporous PES support membrane was laminated to only one side of the liquid crystal polymer film, and a porous PES support membrane was laminated to the other side of the liquid crystal polymer film.

The nonporous PES support membrane was lightly bonded to the liquid crystal polymer film, having a bond strength of 100 g/cm-width or less; and the porous PES support membrane was strongly bonded to the liquid crystal polymer film, having a bond strength of 1300 g/cm-width or higher. The nonporous PES support membrane was removed from the surface of the liquid crystal polymer film, yielding a liquid crystal polymer film having balanced physical properties about 70 micrometers thick and strongly bonded on one side to a porous PES support membrane.

EXAMPLE 5

A mixture containing 90 wt. % liquid crystal polymer (SUMIKA SUPER E 6000, manufactured by Sumitomo Chemical Co.) and 10 wt. % natural silica particles (FS-15, mean particle size of 3 micrometers, manufactured by Denki Kagaku) were mixed at 350° C. in a twin-screw extruder, extruded from a strand die, and formed into extrusion pellets with a pelletizer.

A film of liquid crystal polymer containing 10 wt. % natural silica was prepared by melt-extruding the pellets through a T-die using a single-screw extruder (screw diameter: 50 mm). The T-die temperature was 350° C. An anisotropic uniaxially-oriented liquid crystal polymer film (film 5-A), about 250 mm wide and 266 micrometers thick, was produced. Thickness, surface roughness, and tensile property measurements as described hereinabove were made on samples taken from film 5-A, and are shown in Table 1.

Porous expanded PTFE membranes (thickness: 50 micrometers; nominal pore size: 3 micrometers; pore volume: 80%; manufactured by Japan Gore-Tex, Inc.) were bonded to each side of a length of liquid crystal polymer film 5-A to form a composite material laminate (5-AL). The materials were laminated by application of heat and pressure in passage through the nip between metal rolls heated to 350° C., at a nip pressure of about 50 kg/cm. The composite material laminate thus formed was cooled by passage between 50 mm diameter rolls having a surface temperature of about 150° C. A sample of film 5-AL was tested and found to have a bond strength between the support membranes and liquid crystal polymer film of about 1000 g/cm-width.

The composite material laminate 5-AL was heated to a temperature of about 350° C., and uniaxially stretched in the transverse direction an amount 6:1 to form a stretched composite material laminate (film 5-ALE). The stretch rate was about 100%/sec. The stretched composite material laminate had a liquid crystal polymer layer (containing 10 wt. % silica particles) 40 micrometers thick, a total thickness of 60 micrometers, and had balanced physical properties. Samples of film 5-ALE were taken for tensile testing, and the results are shown in Table 1.

EXAMPLE 6

Porous expanded PTFE membranes (thickness: 50 micrometers; nominal pore size: 0.5 micrometers; pore volume: 80%; manufactured by Japan Gore-Tex, Inc.) were bonded to each side of a length of liquid crystal polymer film 5-A to form a composite material laminate (6-AL). The materials were laminated by application of heat and pressure in passage through the nip between metal rolls heated to 250° C., at a nip pressure of about 10 kg/cm. The composite material laminate thus formed was cooled by passage between 50 mm diameter rolls having a surface temperature of about 150° C. A sample of film 6-AL was tested and found to have a bond strength between the support membranes and liquid crystal polymer film of about 5 g/cm-width.

The composite material laminate 6-AL was heated to a temperature of about 350° C., and uniaxially stretched in the transverse direction an amount 6:1 to form a stretched composite material laminate (film 6-ALE). The stretch rate was about 100%/sec.

The porous expanded PTFE support membranes were removed from both sides of the composite material laminate, yielding a liquid crystal polymer film (6-AE) containing 10 wt. % silica particles 47 micrometers thick and having balanced physical properties. Samples of film 6-AE were taken for thickness, surface roughness, and tensile property measurements as described hereinabove, and the results are shown in Table 1.

EXAMPLE 7

A mixture containing 95 wt. % liquid crystal polymer (SUMIKA SUPER E 6000, manufactured by Sumitomo Chemical Co.) and 5 wt. % titanium oxide particles (CR-60, mean particle size of 0.21 micrometers, manufactured by Ishihara Sangyo Kaisha) were mixed at 350° C. in a twin-screw extruder, extruded from a T-die, and formed into extrusion pellets.

A film of liquid crystal polymer containing 5 wt. % titanium oxide was prepared by melt-extruding the pellets through a T-die using a single-screw extruder (screw diameter: 50 mm). The T-die temperature was 350° C. An anisotropic uniaxially-oriented liquid crystal polymer film (film 7-B), about 250 mm wide and 278 micrometers thick, was produced. Thickness, surface roughness, and tensile property measurements as described hereinabove were made on samples taken from film 7-B, and are shown in Table 1.

Porous expanded PTFE membranes (thickness: 50 micrometers; nominal pore size: 3 micrometers; pore volume: 80%; manufactured by Japan Gore-Tex, Inc.) were bonded to each side of a length of liquid crystal polymer film 7-B to form a composite material laminate (7-BL). The materials were laminated by application of heat and pressure in passage through the nip between metal rolls heated to 350° C., at a nip pressure of about 50 kg/cm. The composite material laminate thus formed was cooled by passage between 50 mm diameter rolls having a surface temperature of about 150° C. A sample of film 7-BL was tested and found to have a bond strength between the support membranes and liquid crystal polymer film of about 1000 g/cm-width.

The composite material laminate 7-BL was heated to a temperature of about 350° C., and uniaxially stretched in the transverse direction an amount 6:1 to form a stretched composite material laminate (film 7-BLE). The stretch rate was about 100%/sec. The stretched composite material laminate had a liquid crystal polymer layer (containing 5 wt. % titanium oxide particles) 40 micrometers thick, a total thickness of 60 micrometers, and had balanced physical properties. Samples of film 7-BLE were taken for tensile testing, and the results are shown in Table 1.

EXAMPLE 8

Porous expanded PTFE membranes (thickness: 50 micrometers; nominal pore size: 0.5 micrometers; pore volume: 80%; manufactured by Japan Gore-Tex, Inc.) were bonded to each side of a length of liquid crystal polymer film 7-B to form a composite material laminate (8-BL). The materials were laminated by application of heat and pressure in passage through the nip between metal rolls heated to 250° C., at a nip pressure of about 10 kg/cm. The composite material laminate thus formed was cooled by passage between 50 mm diameter rolls having a surface temperature of about 150° C. A sample of film 8-BL was tested and found to have a bond strength between the support membranes and liquid crystal polymer film of about 5 g/cm-width.

The composite material laminate 8-BL was heated to a temperature of about 350° C., and uniaxially stretched in the transverse direction an amount 6:1 to form a stretched composite material laminate (film 8-BLE). The stretch rate was about 100%sec.

The porous expanded PTFE support membranes were removed from both sides of the composite material laminate, yielding a liquid crystal polymer film (8-BE) containing 5 wt. % titanium oxide 47 micrometers thick and having balanced physical properties. Samples of film 8-BE were taken for thickness, surface roughness, and tensile property measurements as described hereinabove, and the results are shown in Table 1.

EXAMPLE 9

A film of thermotropic liquid crystal polymer resin (SUMIKA SUPER E 6000, manufactured by Sumitomo Chemical Co.) was prepared by melt-extrusion through a T-die using a single-screw extruder (screw diameter: 50 mm). The T-die temperature was 320° C. An anisotropic uniaxially-oriented liquid crystal polymer film (film 9-C), about 250 mm wide and 284 micrometers thick, was produced.

Porous expanded PTFE membranes (thickness: 50 micrometers; nominal pore size: 3 micrometers; pore volume: 80%; manufactured by Japan Gore-Tex, Inc.) were bonded to each side of a length of liquid crystal polymer film 9-C to form a composite material laminate (9-CL). The materials were laminated by application of heat and pressure in passage through the nip between metal rolls heated to 350° C., at a nip pressure of about 50 kg/cm. The composite material laminate thus formed was cooled by passage between 50 mm diameter rolls having a surface temperature of about 150° C. A sample of film 9-CL was tested and found to have a bond strength between the support membranes and liquid crystal polymer film of about 1000 g/cm-width.

The composite material laminate 9-CL was heated to a temperature of about 350° C., and uniaxially stretched in the transverse direction an amount 6:1 to form a stretched composite material laminate (film 9-CLE). The stretch rate was about 100%/sec. The stretched composite material laminate had a liquid crystal polymer layer 45 micrometers thick, a total thickness of 58 micrometers, and had balanced physical properties. Samples of film 9-CLE were taken for tensile testing, and the results are shown in Table 1.

EXAMPLE 10

Porous expanded PTFE membranes (thickness: 50 micrometers; nominal pore size: 0.5 micrometers; pore volume: 80%; manufactured by Japan Gore-Tex, Inc.) were bonded to each side of a length of liquid crystal polymer film 9-C to form a composite material laminate (10-CL). The materials were laminated by application of heat and pressure in passage through the nip between metal rolls heated to 250° C., at a nip pressure of about 10 kg/cm. The composite material laminate thus formed was cooled by passage between 50 mm diameter rolls having a surface temperature of about 150° C. A sample of film 10-CL was tested and found to have a bond strength between the support membranes and liquid crystal polymer film of about 100 g/cm-width.

The composite material laminate 10-CL was heated to a temperature of about 350° C., and uniaxially stretched in the transverse direction an amount 6:1 to form a stretched composite material laminate (film 10-CLE). The stretch rate was about 100%/sec.

The porous expanded PTFE support membranes were removed from both sides of the composite material laminate, yielding a liquid crystal polymer film (film 10-CE) 47 micrometers thick and having balanced physical properties. Samples of film 10-CE were taken for thickness, surface roughness, and tensile property measurements as described hereinabove, and the results are shown in Table 1.

TABLE 1

| Film No. | Thickness, $\mu$m Mean, | Thickness, $\mu$m Std. Dev., | Surface Roughness $\mu$m | Tensile Strength, kg/mm$^2$ Longitudinal | Tensile Strength, kg/mm$^2$ Transverse |
|---|---|---|---|---|---|
| 5-A | 266 | 11 | 4.2 | 55 | 4 |
| 5-ALE | — | — | — | 14 | 15 |
| 6-AE | 47 | 2 | 0.5 | 18 | 19 |
| 7-B | 278 | 8 | 3.5 | 61 | 3 |
| 7-BLE | — | — | — | 18 | 17 |
| 8-BE | 48 | 1 | 0.4 | 21 | 20 |
| 9-C | 284 | 66 | 48 | 35 | 3 |
| 9-CLE | — | — | — | 13 | 12 |
| 10-CE | 47 | 8 | 5 | 15 | 16 |

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

I claim:

1. A composite material comprising:
   (a) a first support membrane of synthetic polymer;
   (b) a nonporous stretched oriented film comprising a mixture of liquid crystal polymer and solid particulate material;
   said film containing sufficient solid particulate material to reduce thickness variability whereby the ratio of the standard deviation of thickness values to the mean thickness value of the film is 0.1 or less;
   (c) a second support membrane of synthetic polymer;
   said first and second support membranes and said nonporous stretched oriented film adhered together in laminar relationship to form a composite material having a sandwich structure comprising said nonporous stretched oriented film between said support membranes;

said composite material being stretched in at least one direction to multiaxially orient the liquid crystal polymer of said nonporous stretched oriented film;

said nonporous stretched multiaxially oriented film comprising a mixture of liquid crystal polymer and solid particulate material having substantially equal values in at least one physical property selected from the group consisting of tensile strength, tensile elongation, and thermal expansion, in the direction of stretch and in the direction normal to the direction of stretch; and wherein the ratio of the standard deviation of thickness values to the mean thickness value of the film is 0.1 or less.

2. The composite material as recited in claim 1, wherein the concentration of said solid particulate material in said nonporous stretched oriented film is in the range 1 to 30 volume percent.

3. The composite material as recited in claim 1, wherein said first and second support membranes are porous membranes.

4. The composite material as recited in claim 3, wherein at least one said porous membrane is a porous polytetrafluoroethylene membrane.

5. The composite material as recited in claim 3, wherein at least one said porous membrane is a porous polyethersulfone membrane.

6. The composite material as recited in claim 1, wherein said first and second support membranes are nonporous membranes.

7. The composite material as recited in claim 6, wherein at least one said nonporous membrane is a nonporous polyethersulfone membrane.

8. The composite material as recited in claim 1, wherein one said support membrane is a porous membrane and one said support membrane is a nonporous membrane.

9. The composite material as recited in claim 8, wherein the material forming said membranes is selected from the group consisting of polytetrafluoroethylene and polyethersulfone.

10. A process for manufacturing a multiaxially-oriented liquid crystal polymer film comprising the steps of:

(a) providing an anisotropic liquid crystal polymer film wherein the liquid crystal polymer is oriented in substantially the same planar direction, wherein said liquid crystal polymer film contains solid particulate material and wherein said solid particulate material is added in a concentration sufficient to reduce the thickness variability of the film whereby the ratio of the standard deviation of thickness values to the mean thickness value of the film is 0.1 or less;

(b) sandwiching said anisotropic liquid crystal polymer film between two polymeric support membranes;

(c) bonding said anisotropic liquid crystal polymer film to said polymeric support membanes by application of heat and pressure to form a composite material;

(d) heating the composite material of step (c) while under tension to a temperature above the melt point of the liquid crystal polymer;

(e) stretching the heated composite material of step (d) in at least the planar direction normal to the direction of orientation of said liquid crystal polymer film to multiaxially orient the liquid crystal polymer;

(f) cooling the multiaxially-oriented product of step (e);

thereby producing a liquid crystal polymer film having substantially equal values of at least one physical property selected from the group consisting of tensile strength, tensile elongation, and thermal expansion, in the direction of stretch and in the planar direction normal to the direction of stretch and wherein the ratio of the standard deviation of thickness values to the mean thickness value of the film is 0.1 or less.

11. The process for manufacturing a multiaxially-oriented liquid crystal polymer film as recited in claim 10, wherein the concentration of said solid particulate material in said liquid crystal polymer film is in the range 1 to 30 volume percent.

12. The process for manufacturing a multiaxially-oriented liquid crystal polymer film as recited in claim 10, wherein both said support membranes are porous membranes.

13. The process for manufacturing a multiaxially-oriented liquid crystal polymer film as recited in claim 12, wherein at least one said porous membrane is a porous polytetrafluoroethylene membrane.

14. The process for manufacturing a multiaxially-oriented liquid crystal polymer film as recited in claim 12, wherein at least one said porous membrane is a porous polyethersulfone membrane.

15. The process for manufacturing a multiaxially-oriented liquid crystal polymer film as recited in claim 10, wherein both said support membranes are nonporous membranes.

16. The process for manufacturing a multiaxially-oriented liquid crystal polymer film as recited in claim 15, wherein at least one said nonporous membrane is a nonporous polyethersulfone membrane.

17. The process for manufacturing a multiaxially-oriented liquid crystal polymer film as recited in claim 10, wherein one said support membrane is a porous membrane and one said support membrane is a nonporous membrane.

18. The process for manufacturing a multiaxially-oriented liquid crystal polymer film as recited in claim 17, wherein the material forming at least one said support membrane is selected from the group consisting of polytetrafluoroethylene and polyethersulfone.

19. The process for manufacturing a multiaxially-oriented liquid crystal polymer film as recited in claim 10, further comprising the step of removing the support membrane from one or both surfaces of the liquid crystal polymer film.

20. A multiaxially-oriented liquid crystal polymer film made by the process as recited in claim 19.

21. A multiaxially-oriented liquid crystal polymer film made by the process as recited in claim 10.

* * * * *